Sept. 15, 1959 G. ELLIOTT 2,904,705

ELECTRONIC SWITCH

Filed Aug. 29, 1955

INVENTOR.
GEORGE ELLIOTT

BY F. H. Henson

AGENT

United States Patent Office 2,904,705

Patented Sept. 15, 1959

2,904,705

ELECTRONIC SWITCH

George Elliott, Rochester, N.Y., assignor to General Dynamics Corporation, a corporation of Delaware Application August 29, 1955, Serial No. 531,145

6 Claims. (Cl. 307—88.5)

This invention relates in general to electrical circuits, and more particularly to electronic switches for use in controlling electrical circuits.

With the advent of electronic telephone and other communication systems, a need has arisen for an inexpensive electronic switch capable of switching communication and control signals without undue attenuation or distortion. For example, in the electronic telephone system disclosed in my copending application, Serial No. 492,064, filed March 4, 1955, Patent No. 2,830,120, and assigned to the same assignee as the present invention, electronic switches are utilized to close the communication circuit between a calling line and a selected called line, to connect the various supervisory signals to the lines, and for many other purposes.

Accordingly, it is the general object of this invention to provide new and improved switches for opening and closing electrical circuits.

It is a more particular object of this invention to provide new and improved electronic switches for opening and closing electrical circuits.

The present invention accomplishes the above cited objects by providing a bi-stable triggered electronic switch which comprises a double base diode. A description of the double base diode may be found in an article by I. A. Lesk and V. P. Mathis, "The Double-Base Diode—A New Semiconductor Device," Convention Record of the I.R.E., part 6, March 1953. Briefly, a double base diode comprises a bar of semi-conductive material having two base electrodes and an emitter electrode. The base electrodes make an ohmic connection with opposite ends of the bar while the emitter electrode makes a rectifying junction connection to the bar at a distance approximately .7 of the length of the bar from a first one of the base electrodes. When the emitter junction is biased in the reverse direction, the resistivity of the bar is rather high and since the bar is essentially a linear resistance, the voltage of the area of the bar adjacent to the junction is approximately .7 of the voltage applied between the first and second base electrodes. When the emitter junction is biased in the forward direction, either holes or electrons, depending upon whether the bar material is N or P type respectively, are injected into the bar from the emitter so as to lower the resistivity of the bar between the emitter and the first base electrode. This, of course, results in lowering the potential of the bar at the point opposite the junction toward the potential of the first base electrode so that the rate of injection of holes or electrons is increased. Thus, the emitter input characteristic shows a negative impedance region and the device is bi-stable in operation.

According to the invention, a first circuit or line is connected between the first base electrode and a point of reference or ground potential, and a second circuit or line is connected between the emitter electrode and the point of reference potential. When the switch is in its low current conduction state, the switch presents a very high impedance between the two circuits or lines. When the switch is in its high current conduction state, signals appearing on either line are passed by the switch in a bilateral manner with virtually no attenuation. The switch is triggered from its low current conduction state to its high current conduction state, or from its high current conduction state to its low current conduction state, by the application of pulses of suitable polarity to one or more of the electrodes.

Further objects and advantages of the invention will become apparent as the following description proceeds and features of novelty which characterize the invention will be pointed out in particularity in the claims annexed to and forming a part of this specification.

For a better understanding of the invention, reference may be had to the drawing which comprises three figures on one sheet.

Figure 1:
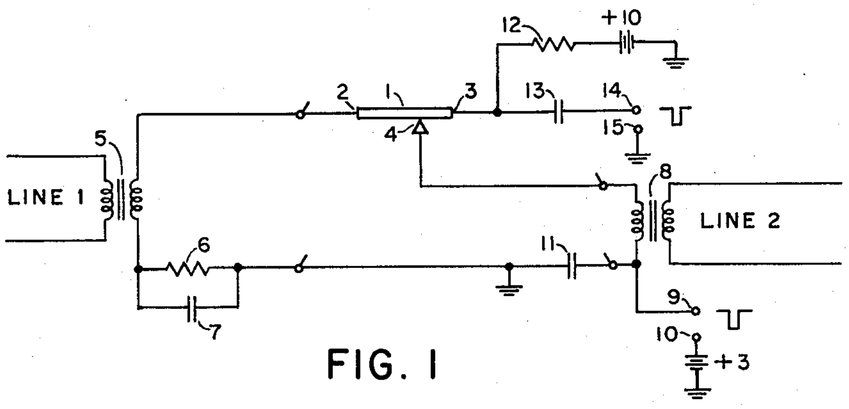
Fig. 1 shows a double base diode bilateral switch with trigger pulses of the same polarity applied to different electrodes to control the "off-on" condition of the switch.
Figure 2:
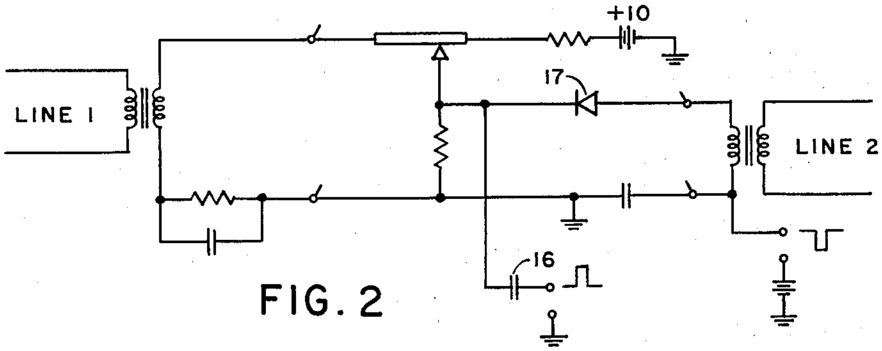
Fig. 2 shows a double base diode bilateral switch with trigger pulses of opposite polarity applied to one electrode to control the "off-on" condition of the switch.

For purposes of illustration, the double base diodes shown in Figs. 1 and 2 are assumed to be of the type in which the bar material is N type and the junction material is P type. As is well known in the art, the circuit would function with a double base diode in which the bar material was P type and the junction material N type if the biasing and trigger pulse polarities were reversed.

Referring to Fig. 1 of the drawing, it can be seen that double base diode 1 comprises base electrodes 2 and 3 and emitter electrode 4. Line 1 is connected between base electrode 2 and a point of reference or ground potential by transformer 5. The upper terminal of the secondary winding of transformer 5 is connected to base electrode 2 and the lower terminal of the secondary winding of transformer 5 is connected through current limiting resistor 6 to ground potential. Capacitor 7 is connected in parallel with resistor 6 to by-pass the switched A.-C. signals. Line 2 is connected between emitter electrode 4 and the point of reference potential by transformer 8. The upper terminal of the secondary winding of transformer 8 is connected to emitter electrode 4 and the lower terminal of the secondary winding of transformer 8 is connected through the source of "off" or release pulse signals, connected across terminals 9 and 10, and through the +3 volt battery to ground. Capacitor 11 serves to decouple the switched A.-C. signals from the +3 volt battery.

Bias potential is supplied to the second base electrode 3 through base current limiting resistor 12 by the +10 volt battery. The negative terminal of the +10 volt battery is, of course, connected to ground. "On" pulses are coupled through capacitor 13 to the second base electrode 3 from a suitable source of pulses connected across terminals 14 and 15.

To illustrate a use of the switch and a possible derivation of the "off-on" trigger pulses, reference is made to the electronic telephone system disclosed in the above-identified copending application in which an electronic switch is interposed in a connection between each line and a multiple point for each link and the line finder and connector circuits of each link serve to transmit switch control pulses to the electronic switches associated with that link in the time position of the calling and called lines, respectively. The switch control pulses are gated with continuous pulses in the individual time position of the switch associated with each line. Since the switch control pulses transmitted by the line finder correspond in time position with just the calling line, only the switch associated with the calling line is activated to connect that line to a link multiple point. Similarly, the switch associated with the called line is activated by connector transmitted switch control pulses to connect the called line to the link multiple point. The calling and called subscribers then converse through the activated switches. Thus it can be seen that the "on" pulse appearing across terminals 14 and 15 could be a pulse in the time position of a subscriber's line connected to line 1, while line 2 could be the link multiple point. The multiple connection notations, shown in Fig. 1, illustrate that the secondary winding of transformer 5 could be multipled to a number of switches corresponding to the number of links in the system, while the secondary winding of transformer 8 could be multipled to the electronic switches associated with each line of the system. In a 100 line, 15 link system, there would be 1500 electronic switches with a switch connected between each line and a multiple point for each link.

When the link is idle, the transmittal of switch control pulses is, of course, terminated and release pulses are transmitted to all of the electronic switches associated with that link. The "off" pulse appearing across terminals 9 and 10 could be a release pulse derived from the release pulse generator disclosed in the above-identified copending application.

If it be assumed that the switch shown in Fig. 1 is in its low current conduction state, the rectifying junction between the bar of the double base diode and emitter electrode 4 is biased in the reverse direction since the emitter is negative with respect to the portion of the bar opposite the junction. With the voltages shown, emitter electrode 4 is at +3 volts while the portion of the bar opposite the junction is at approximately +7 volts since base electrode 2 is connected to ground potential, base electrode 3 is connected to +10 volts, and the rectifying junction is located at a distance approximately .7 of the length of the bar from base electrode 2. Negative release pulses connected across terminals 9 and 10 have no effect on the condition of the switch at this time since they tend to make the emitter still more negative with respect to the bar.

When it is desired to trigger the switch to its high current conduction state, the transmission of release pulses is terminated and negative going switch control pulses appear across terminals 14 and 15 and are coupled to base electrode 3 by capacitor 13. A negative pulse on base electrode 3 renders the portion of the bar opposite the junction negative with respect to the emitter and the switch is triggered to its high current conduction state.

Figure 3:
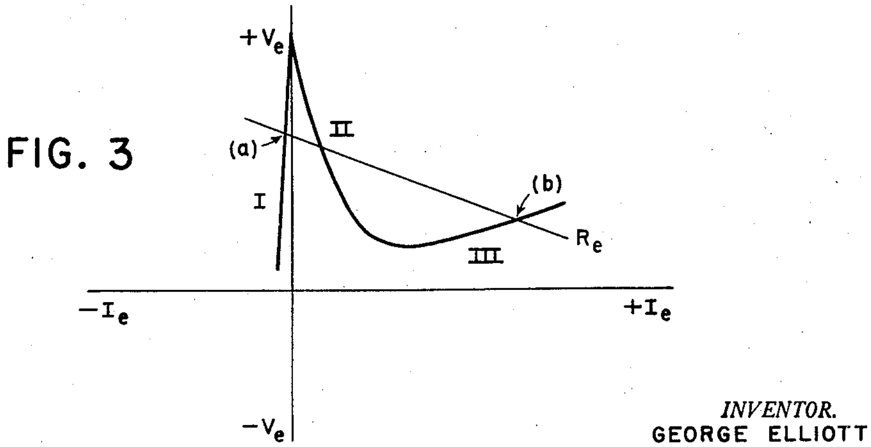
Fig. 3 shows the emitter input characteristic of a double base diode.

The operation of the switch is graphically illustrated in Figure 3 of the drawing which shows the emitter input characteristic of the double base diode. It can be seen that the load line $Re$ has three intersections with the emitter characteristic curve. As is well known in the art, the intersection with the characteristic is unstable in negative resistance region II, whereas those in positive resistance regions I and III are stable. If it be assumed that the switch is in the low current conduction state, the circuit is at operating point (*a*). It can be seen that negative release pulses connected to the emitter electrode at this time have no effect on the circuit. However, when a negative pulse is applied to the base electrode 3, which is equivalent to applying a positive pulse to the emitter electrode, the load line moves upward and the assumed operating point (*a*) moves upward along the region I portion of the characteristic. At the turning or peak point of the characteristic, the operating point suddenly flips to the high current region III, returning to point (*b*) as the base voltage is returned to its original value. It can be seen that a negative pulse on the emitter is required to shift the operating point from (*b*) to (*a*). Thus, the negative "on" pulses applied to base electrode 3, which as previously mentioned is equivalent to applying positive pulses to emitter electrode 4, have no further effect on the circuit and the switch remains in its high current conduction state until a negative release pulse is applied to emitter electrode 4.

It is to be noted that signals appearing in either line 1 or line 2 must be limited either by limiting diodes or by other suitable means so as not to exceed the voltage required to shift point (*a*) to the peak point of the characteristic when the switch is in its low current conduction state, and so as not to exceed the voltage required to shift point (*b*) to the valley point of the characterstic when the switch is in the high current conduction state. Otherwise, the switched signals may turn the switch "on" and "off."

Figure 2 shows an alternate arrangement in which the trigger pulses are applied to the emitter electrode. The circuit differs from the circuit of Figure 1 in that positive "on" pulses are applied to the emitter electrode through a coupling capacitor, such as 16, to trigger the circuit to its high current conduction state. Crystal diode 17 is included in the circuit to provide a more sensitive or higher impedance point to which to apply the "on" pulses. Diode 17 also serves to increase the "off-on" impedance ratio of the switch and thereby decrease "off" cross-talk.

While there has been shown what is considered at present to be the preferred embodiment of the invention, other modifications will readily occur to those skilled in the art. It is not, therefore, desired that the invention be limited to the specific arrangements shown and described, and it is intended to cover in the appended claims all such modifications as fall within the true spirit and scope of the invention.

What is claimed is:

1. In combination, an electronic switch comprising a body of semi-conductive material, a first electrode having an ohmic connection to said body, a second electrode having an ohmic connection to said body, and a third electrode having a rectifying junction connection to said body, a first transmission line on which alternating current signals may appear, means for connecting said first line between said first electrode and a point of reference potential, a second transmission line on which alternating current signals may appear, means for connecting said second line between said third electrode and said point of reference potential, means for connecting a source of bias potential between said second electrode and said point of reference potential, and means for selectively controlling said switch either to block the transmission of signals between said first and second lines or to permit the bilateral transmission of signals between said first and second lines.

2. In combination, a bi-stable triggered electronic switch comprising a body of semi-conductive material, a first electrode having an ohmic connection to said body, a second electrode having an ohmic connection to said body, and a third electrode having a rectifying junction connection to said body, a first transmission line on which alternating current signals may appear, means for connecting said first line between said first electrode and a point of reference potential, a second transmission line on which alternating current signals may appear, means for connecting said second line between said third electrode and said point of reference potential, means for connecting a source of bias potential between said second electrode and said point of reference potential, said switch having a stable state of low current conduction which blocks the transmission of signals between said first and second lines and another stable state of high current conduction which permits the bilateral transmission of signals between said first and second lines, and means for selectively triggering said switch either to said first state of conduction or to said second state of conduction.

3. The combination of claim 2 wherein said selective triggering means comprises means for applying a trigger pulse to one of said electrodes for triggering said switch to its state of high current conduction and means for applying a trigger pulse of the same polarity to another one of said electrodes for triggering said switch to its state of low current conduction.

4. The combination of claim 2 wherein said selective triggering means comprises means for applying a trigger pulse of one polarity to one of said electrodes for triggering said switch to its state of high current conduction and means for applying a trigger pulse of opposite polarity to said one electrode for triggering said switch to its state of low current conduction.

5. In combination, a first transmission line on which alternating current signals may appear, a second transmission line on which alternating current signals may appear, a bis-stable triggered electronic switch for connecting and disconnecting said lines, said switch comprising a double base diode having first and second base electrodes, and an emitter electrode, means for connecting said first line between said first base electrode and a point of reference potential, means for connecting said second line between said emitter electrode and said point of reference potential, means for connecting a source of bias potential between said second base electrode and said point of reference potential, said switch having a stable state of low current conduction which blocks the transmission of signals between said first and second lines and another state of high current conduction which permits the bilateral transmission of signals between said first and second lines, means for applying a trigger pulse to one of said electrodes for triggering said switch to its state of high current conduction, and means for applying a trigger pulse of the same polarity to another one of said electrodes for triggering said switch to its state of low current conduction.

6. In combination, a first transmission line on which alternating current signals may appear, a second transmission line on which alternating current signals may appear, a bi-stable triggered electronic switch for connecting and disconnecting said lines, said switch comprising a double base diode having first and second base electrodes, and an emitter electrode, means for connecting said first line between said first base electrode and a point of reference potential, means for connecting said second line between said emitter electrode and said point of reference potential, means for connecting a source of bias potential between said second base electrode and said point of reference potential, said switch having a stable state of low current conduction which blocks the transmission of signals between said first and second lines and another state of high current conduction which permits the bilateral transmission of signals between said first and second lines, means for applying a trigger pulse of one polarity to one of said electrodes for triggering said switch to its state of high current conduction, and means for applying a trigger pulse of opposite polarity to said one electrode for triggering said switch to its state of low current conduction.

References Cited in the file of this patent

UNITED STATES PATENTS

| | | |
|---|---|---|
| 2,691,073 | Lowman | Oct. 5, 1954 |
| 2,718,613 | Harris | Sept. 20, 1955 |
| 2,763,832 | Shockley | Sept. 18, 1956 |
| 2,769,926 | Lesk | Nov. 6, 1956 |

OTHER REFERENCES

Electronics, March 1955, pp. 199–202, "Double-Base Diode Applications," Suran.